(12) United States Patent
Bringivijayaraghavan

(10) Patent No.: US 10,170,164 B1
(45) Date of Patent: Jan. 1, 2019

(54) SENSE AMPLIFIER LATCH CIRCUIT AND SENSE AMPLIFIER MULTIPLEXED LATCH CIRCUIT

(71) Applicant: GLOBALFOUNDRIES INC., Grand Cayman (KY)

(72) Inventor: Venkatraghavan Bringivijayaraghavan, Cheyyar (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/895,001

(22) Filed: Feb. 13, 2018

(51) Int. Cl.
*G11C 7/00* (2006.01)
*G11C 7/06* (2006.01)

(52) U.S. Cl.
CPC .................................. *G11C 7/065* (2013.01)

(58) Field of Classification Search
CPC ........... G11C 7/06; G11C 7/062; G11C 7/065; H03K 3/356017; H03K 3/356104
See application file for complete search history.

(56) References Cited

U.S. PATENT DOCUMENTS

| 6,320,816 | B2 | 11/2001 | Seyyedy et al. |
| 6,378,008 | B1 | 4/2002 | Gradinariu |
| 6,906,558 | B2 | 6/2005 | Lee et al. |
| 7,298,180 | B2 * | 11/2007 | Hung .................... G11C 7/065 327/52 |
| 7,313,040 | B2 | 12/2007 | Huang et al. |
| 8,536,898 | B2 | 9/2013 | Rennie et al. |
| 9,761,285 | B1 * | 9/2017 | Bringivijayaraghavan ................. G11C 7/065 |

* cited by examiner

*Primary Examiner* — An T Luu
(74) *Attorney, Agent, or Firm* — Michael LeStrange; Hoffman Warnick LLC

(57) ABSTRACT

Embodiments of the present disclosure provide a circuit structure including: a circuit driven by first and second sense amplifier (SA) output; a first driver having a first PMOS coupled to a node and to a pair of serially coupled NMOSs, wherein the first SA output is coupled to the first PMOS and the first NMOS of the first driver; a second driver having a second PMOS coupled to a node and a pair of coupled NMOSs, wherein the second SA output is coupled to the second PMOS and second NMOS of the second driver; a first and second supply PMOS, wherein first supply PMOS is coupled to the node of the first driver and to the second supply PMOS and first NMOS of the second driver, and wherein the second supply PMOS is coupled to node of second driver and to the first supply PMOS and second NMOS of first driver.

20 Claims, 4 Drawing Sheets

SENSE AMPLIFIER LATCH CIRCUIT AND SENSE AMPLIFIER MULTIPLEXED LATCH CIRCUIT

TECHNICAL FIELD

Embodiments of the disclosure relate generally to a sense amplifier latch circuit and a sense amplifier multiplexed latch circuit scheme that provides a reduction in memory density by integrating the sense amplifier into the latch structure. The various embodiments described herein can be used in a variety of applications regarding memory manufacture, for example, SRAM and DRAM.

BACKGROUND

In computer memory, sense amplifier circuits are used to read data from memory. The sense amplifier's role is to sense the low power signals from a bitline. The bitline is comprised of bit data, taking the form of high/1 or low/0 stored in a memory cell. The sense amplifier then amplifies the small voltage swing to identifiable logic levels enabling the data to be interpreted outside the memory cell. The bit data is then latched from the cell's sense amplifier into a buffer or latch circuit where the bit data can be stored. Both sense amplifier circuits and latch circuits are comprised of transistors. A transistor is a critical component for implementing digital and analog circuitry designs. Generally, a transistor, such as a MOSFET or metal oxide semiconductor field effect transistor, includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. MOSFETs may be fabricated in two complementary varieties called p-type metal oxide semiconductor field effect transistors (PMOS) and n-type metal oxide semiconductor (NMOS). PMOS and NMOS differ in their configurations of materials found at their electrical terminals. When gated to a low input, a PMOS transistor will be "switched" on, but if the gated input is high, the PMOS transistor remains off. The opposite is true for NMOS transistors. If an NMOS transistor is gated to a high input, the transistor will be "switched" on, but if the gated input is low, the transistor will turn off. These attributes allow a transistor to be a fundamental component in electronic digital circuitry, e.g., sense amplifiers and latch circuits.

SUMMARY

A first aspect of the present disclosure provides a sense amplifier latch circuit including: a latch circuit driven by a first and second sense amplifier output, a first latch driver having a first PMOS transistor coupled to a latch node and to a pair of serially coupled NMOS transistors, wherein the first sense amplifier output is gate coupled to the first PMOS transistor and the first NMOS transistor of the first latch driver, a second latch driver having a second PMOS transistor coupled to a latch node and to a pair of serially coupled NMOS transistors, wherein the second sense amplifier output is gate coupled to the second PMOS transistor and the second NMOS transistor of the second latch driver, a first and second supply PMOS transistor, wherein an output of the first supply PMOS transistor is coupled to the latch node of the first latch driver and to a gate of both the second supply PMOS transistor and first NMOS transistor of the second latch driver, and wherein an output of the second supply PMOS transistor is coupled to the latch node of the second latch driver and to a gate of both the first supply PMOS transistor and second NMOS transistor of the first latch driver.

A second aspect of the present disclosure provides a sense amplifier latch circuit including: a latch circuit driven by a first and a second sense amplifier outputs, a first latch driver having a PMOS transistor coupled to a latch node and to at least three serially coupled NMOS transistors, wherein the first sense amplifier output is gate coupled to the first PMOS transistor and the third NMOS transistor of the first latch driver, a second latch driver having a second PMOS transistor coupled to a latch node and to at least three serially coupled NMOS transistors, wherein the second sense amplifier output is gate coupled to the second PMOS and the third NMOS transistor of the second latch driver, first and second supply PMOS transistor, wherein an output of the first supply PMOS transistor is coupled to the latch node of the first latch driver and to a gate of both the second supply PMOS transistor and the first NMOS transistor of the second latch driver, and wherein an output of the second supply PMOS transistor is coupled to the latch node of the second latch driver and to a gate of both the first supply PMOS transistor and the first NMOS transistor.

A third aspect of the present disclosure provides a sense amplifier multiplexed latch circuit including: a first latch circuit driven by a first and a second sense amplifier outputs, a first latch driver having a PMOS transistor coupled to a latch node and to at least three serially coupled NMOS transistors, wherein the first sense amplifier output is gate coupled to the first PMOS transistor and the third NMOS transistor of the first latch driver, a second latch driver having a second PMOS transistor coupled to a latch node and to at least three serially coupled NMOS transistors, wherein the second sense amplifier output is gate coupled to the second PMOS and the third NMOS transistor of the second latch driver, a first and second supply PMOS transistor, wherein an output of the first supply PMOS transistor is coupled to the latch node of the first latch driver and to a gate of both the second supply PMOS transistor and the first NMOS transistor of the second latch driver, and wherein an output of the second supply PMOS transistor is coupled to the latch node of the second latch driver and to a gate of both the first supply PMOS transistor and the first NMOS transistor, a second latch circuit driven by a third and fourth sense amplifier outputs, wherein each of the third and fourth outputs are gate coupled to a control PMOS transistor and a first NMOS transistor of a set of serially coupled NMOS transistors, wherein each of the second NMOS transistors, of the set of serially coupled NMOS transistors, are coupled to an output of the second NMOS transistor of the first and second latch, and wherein the control PMOS transistors, gated to the third and fourth outputs, are coupled to the latch nodes of the first and second latch.

BRIEF DESCRIPTION OF THE DRAWINGS

These and other features of this disclosure will be more readily understood from the following detailed description of the various aspects of the disclosure taken in conjunction

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The following description describes various embodiments of a sense amplifier latch circuit and a sense amplifier multiplexed latch circuit. A sense amplifier latch circuit and sense amplifier multiplexed latch circuit are comprised of a sense amplifier integrated into the latch circuit. Both the sense amplifier and the latch circuit include PMOS and NMOS transistors that act as logic switching gates that allow for a memory value, 0 or 1, to either be sensed from the memory cell or the bit of data stored/latched. The integrated embodiments described within this application allow for a 30% reduction in size than current sense amplifiers, latches, and multiplexors, used in conventional technology and are suitable for both high performance and high density static random access memory (SRAM).

Figure 1:
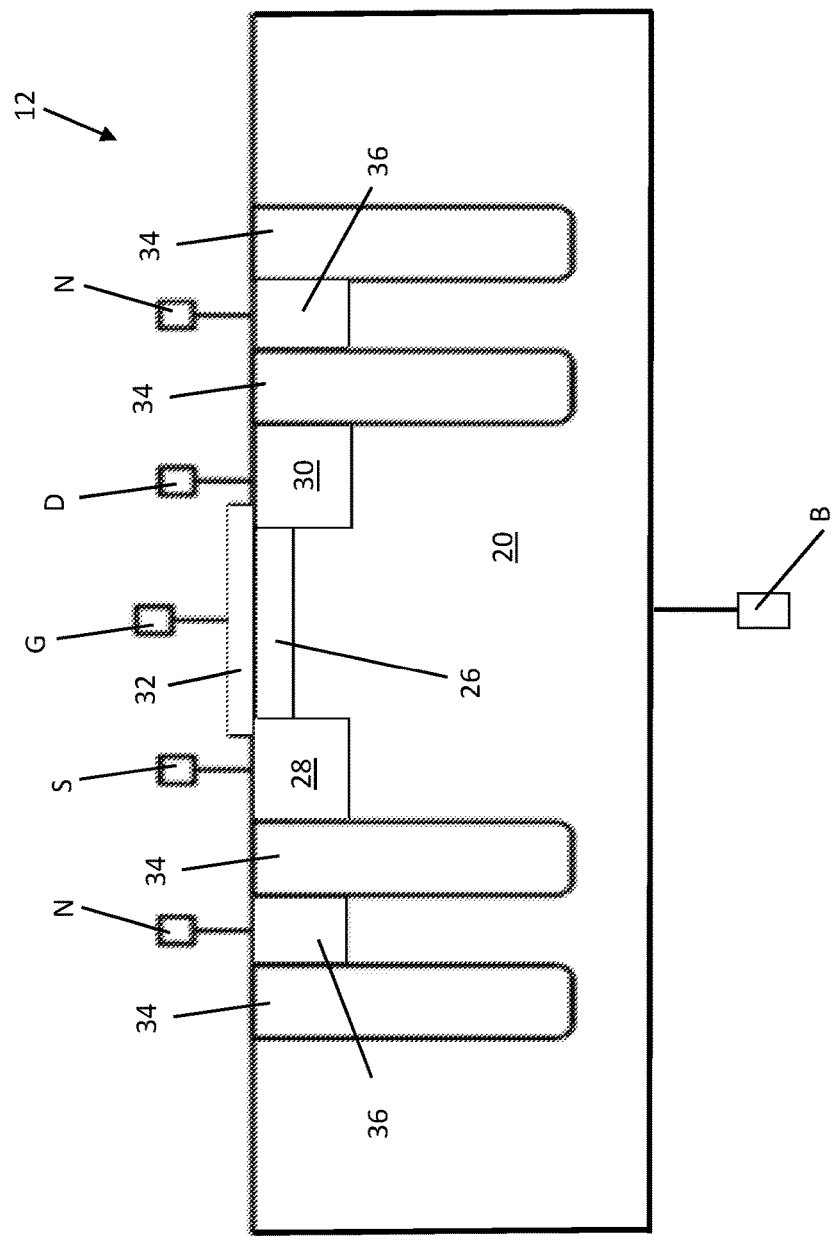
FIG. 1 shows a schematic view of a conventional transistor structure.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques, which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. An additional body terminal B or body node B, such as those found in field effect transistors may be used to bias the transistor during operation.

Figure 2:
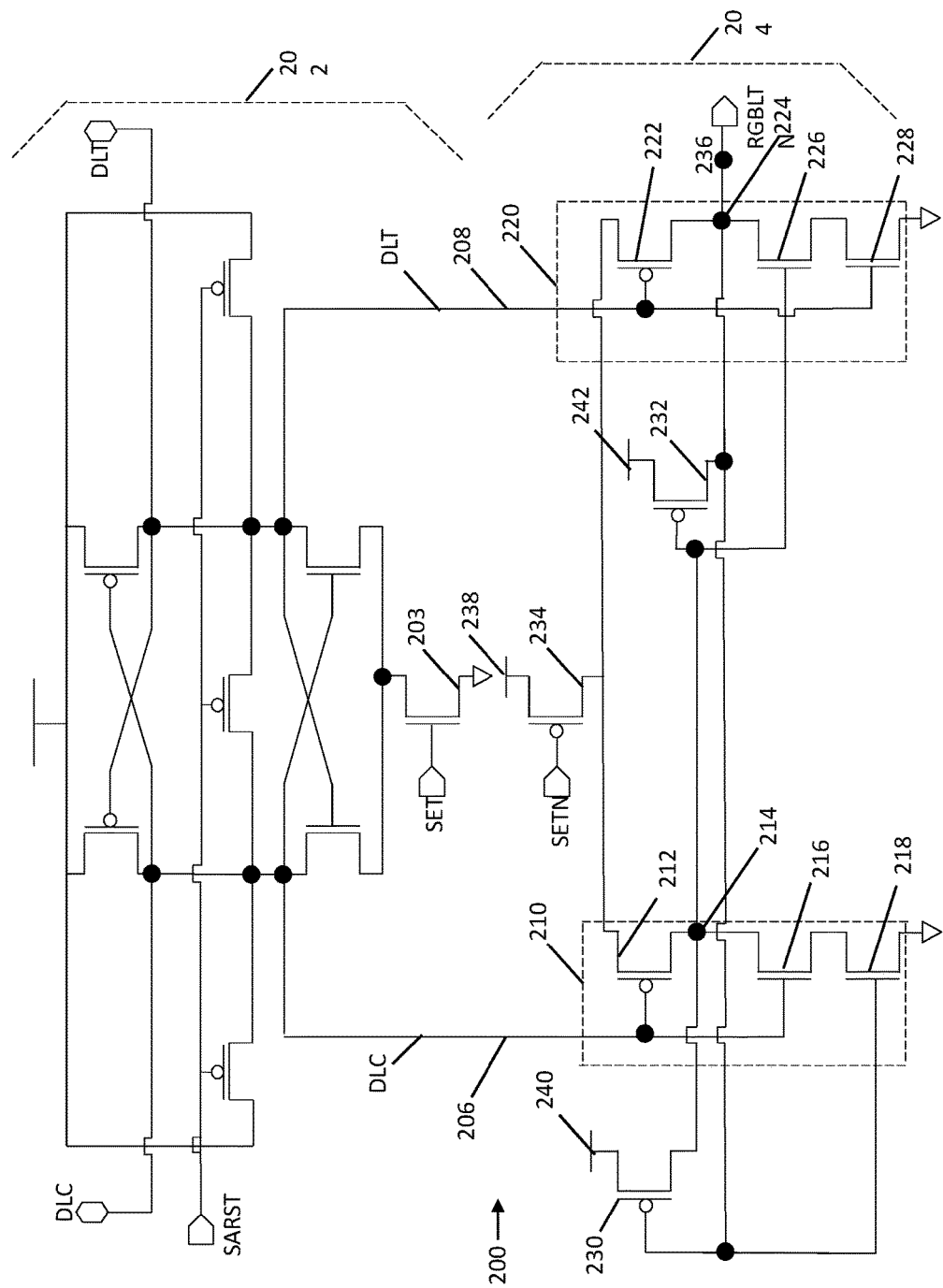
FIG. 2 shows a schematic view of a first embodiment of a sense amplifier latch circuit

Turning to FIG. 2, a schematic view of a sense amplifier latch circuit 200 is illustrated. The technical advantages and features described herein can be attained by using embodiments of the conventional transistor 12 (FIG. 1) for each individual transistor element of sense amplifier latch circuit 200. The sense amplifier latch circuit 200 comprises a conventional sense amplifier 202 and an integrated latch circuit 204. Sense amplifier 202 allows for data to be read from the memory and is able to sense the low power signals, or initial inputs DLT and DLC, from a bitline that represents a high or low data bit stored in a memory cell. After sense amplifier 202 senses the low power signals, sense amplifier 202 amplifies the small voltage swing to readable logic levels, allowing the data to be interpreted properly. Latch circuit 204 allows for the circuit to hold on to the bit of data or to latch the data, ensuring the value does not change. Sense amplifier 202 may be any sense amplifier that allows for integration with latch circuit 204 discussed herein. Integration of latch circuit 204 with sense amplifier 202 occurs when latch circuit 204 uses the same clock or sense enabling signal SET used in sense amplifier 202. Sense amplifier latch circuit 200 can be in at least two modes: sensing mode or latching mode. Sensing takes place when a sense enabling signal or clock signal SET is high and a latching takes place when SET is low.

Specifically, shown in FIG. 2, initial inputs DLC and DLT are input into sense amplifier 202. The initial inputs DLT and DLC are eventually read by a sensing gated transistor 203. This sensing gated transistor may be an NMOS transistor and may be gated to a first sense enabled input signal SET. Sense amplifier 202 determines which of the initial inputs DLC, DLT is high/1 or low/0 and provides two outputs, first and second sense amplifier outputs 206 and 208, with high or low values.

Sense amplifier latch circuit 200 may drive latch circuit 204 via first sense amplifier output 206 and second sense amplifier output 208. First sense amplifier output 206 may be connected to a first latch driver 210. First latch driver 210 may include a first PMOS transistor 212 coupled to a latch node 214 and a pair of serially coupled NMOS transistors 216 and 218. First sense amplifier output 210 is gate coupled to first PMOS transistor 212 and to first NMOS transistor 218 of first latch driver 210. Sense amplifier latch circuit 200 may also include a second latch driver 220. Second latch driver 200 may include a second PMOS transistor 222 coupled to a latch node 224 and to a pair of serially coupled NMOS transistors 226, 228. Second sense amplifier 208 output may be gate coupled to second PMOS 222 and to second NMOS transistor 228 of second latch driver 220.

Sense amplifier latch circuit 200 may also include a first and second supply PMOS transistor 230 and 232. Both the first and second supply PMOS are source coupled to a second and third voltage source 240, 242. An output or drain of first supply PMOS transistor 230 is coupled to latch node 214 of first latch driver 210 and to the gate of second supply PMOS transistor 232 and to the gate of first NMOS transistor 226 of second latch driver 220. The output or drain of second supply PMOS transistor 232 may be coupled to latch node 224 of second latch driver 220 and to the gates of both first supply PMOS transistor 230 and second NMOS transistor 218 of first latch driver 210. First and second PMOS transistors 212 and 222 may be electrically coupled at their respective sources or outputs. In addition, a first gated latch 234 may be coupled to first and second PMOS transistors 212 and 222. This gated latch 234 may be a PMOS transistor. First gated latch 234 may also be gated to a clock input signal SETN and source coupled to a first voltage source 238. When sense enabling signal or clock signal SET is high, clock SETN may be low. When clock SET is low, SETN may be high. Latch circuit 204 further comprises an output node 236, coupled to latch node 224 of second latch driver 220. This output node 236 outputs a signal RGBLTN. RGBLTN can have either a high/1 or a low/0 value.

As previously mentioned, when SET is high, SETN is low and sense amplifier latch circuit 200 is in sensing mode. The following sensing process may occur when DLC is determined to be high and DLT is determined to be low by sense amplifier 202. When SET is high, the NMOS sensing gated transistor 203 is turned on or enabled. This allows the low DLT signal to flow through second sense amplifier output 208. This low signal encounters and enables second PMOS transistor 222. The signal does not activate second NMOS transistor 228 because a low value will not enable an NMOS transistor. SETN inputs a low signal and activates gated latch 234 PMOS transistor. Gated latch 234 PMOS transistor is source coupled to a first voltage source 238. Because SETN is low, gated latch transistor 234 is enabled or turned on. This allows a high value from first voltage source 238 to be outputted to the second PMOS transistor 222 of the second latch driver 220. As previously stated, second PMOS transistor is enabled. This allows the high output to pass through second PMOS transistor # to latch node 224 and output a high value or a 1 RGBLTN signal through output node 236.

Another sensing process, when SET is high and SETN is low, may occur when DLC is determined to be low and DLT is determined to be high by sense amplifier 202. Using the same principles discussed above, when DLC is low, sense amplifier 202 will output the low DLC signal through first sense amplifier output 206. This low value enables or turns on first PMOS transistor 212 of first latch driver 210. SETN inputs a low value to gated latch PMOS transistor # and allows a high output via first voltage source 238 to flow through first PMOS transistor 212 and through latch circuit 204 to activate via the gate of first NMOS transistor 226 of second latch driver 220. Because DLT presently has a high value outputting through second sense amplifier # output, second PMOS transistor 222 of second latch driver 220 will not be enabled, but second NMOS transistor 228 is enabled. Enabling the pair of serially connected NMOS transistors pulls the signal low. This value is pulled low as a result of the serially connected NMOS transistors being connected to ground. As a result, the RGBLTN signal outputting from output node 236 is a low or 0 value.

Another possible process of sense amplifier latch circuit 200 is the latching of data. When SET is low, sense amplifier latch circuit 200 can latch or hold on to the data. If latch circuit 204 is latching a high or 1 value, it is likely that the signal value flowing through both the first and second sense amplifier outputs 206, 208 is high or 1. When SET is low, SETN is high. As a result of this, neither first nor second PMOS transistor 212, 222 is enabled. The high signal from first sense amplifier output 206 will enable first NMOS transistor 216 of first latch driver 210. Because the signal output RGBLTN is 1, from the previous process settings, the gate of second NMOS transistor 218 of first latch driver 210 will be high. The pair of enabled NMOS transistors 216, 218 pull the value of latch node 214 of the first latch driver 210 to low. This low value is then flows to enable the second supply PMOS transistor 232. Supply PMOS transistor 232 is source connected to a third voltage source 242. When enabled supply PMOS transistor 232 allows the voltage source to output a high or 1 value. This value is then outputted through the latch node 224 of the second latch driver 220 and ultimately through the output node 236 where the RGBLTN value of high or 1 is maintained.

Another possible latching process exists when the RGBLTN value is latching a low or 0 value. When SET is low, the sense amplifier latch circuit 200 can latch or hold on to the data. If the latch circuit 204 is latching a low or 0 value, it is likely that the signal value flowing through both the first and second sense amplifier outputs 206, 208 is high or 1. The high value passing through the second sense amplifier output 208 enables the second NMOS transistor 228. Because the signal output RGBLTN is 0, from the previous process setting, supply PMOS transistor 230 is enabled. By enabling supply PMOS transistor 230, a high value is able to pass through the supply PMOS transistor form the second voltage source. This event allows supply PMOS transistor 230 to output a high or 1 value. This high value passes through the latch node 214 of the first latch driver 210 to enable the gate of the first NMOS transistor 226 of the second latch driver. Due to both the first and second NMOS transistors 226 and 228 of the second latch driver 220 being enabled this holds the value of RGBLTN to 0 or low.

Figure 3:
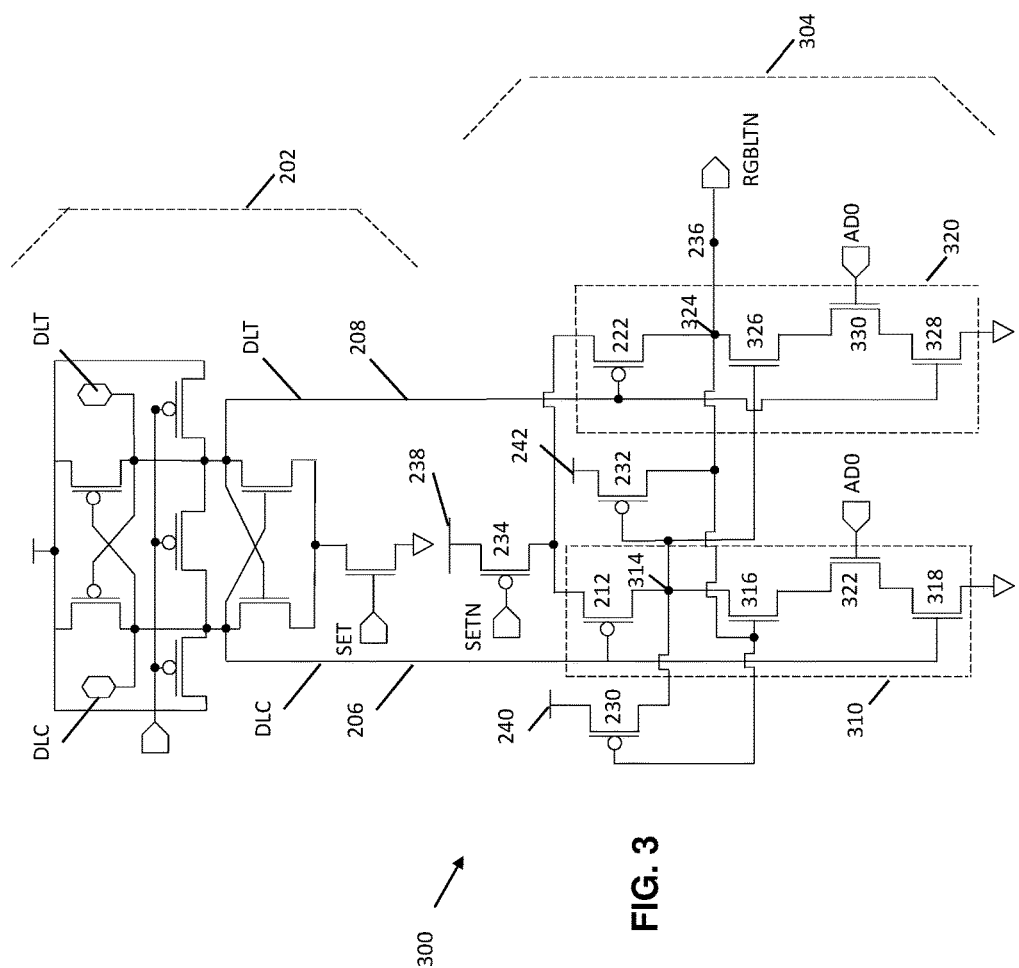
FIG. 3 shows a schematic view of a second embodiment of a sense amplifier latch circuit.

FIG. 3 depicts another embodiment of a sense amplifier latch circuit 300 with additional data inputs. The technical advantages and features described herein may be achievable by using embodiments of the conventional transistor 12 (FIG. 1) for each individual transistor element of sense amplifier latch circuit 300. Where appropriate similar corresponding structures to those identified in FIG. 2 are used in FIG. 3. Sense amplifier latch circuit 300 may have a conventional sense amplifier 202 integrated with a latch circuit 304. Integration of latch circuit 304 into sense amplifier 202 occurs when latch circuitry 304 uses the same clock or sense enabling signal SET used in sense amplifier 202 to drive latch 304. Latch circuit 304 may be driven by a first and second sense amplifier outputs 206, 208. As previously discussed in more detail, sense amplifier 202 has two initial inputs, DLC and DLT that undergo sensing by sense amplifier 202. Depending on the characteristics of these initial inputs, the sense amplifier will provide DLC and DLT outputs having either a high/1 or low/0 value. These values determine how latch circuit 304 operates. First latch driver 310 has a first PMOS transistor 212 that may be coupled to latch node 314. Latch node 314 may then be coupled to at least three serially coupled NMOS transistors 316, 322, 318. First sense amplifier output 206 can be gate coupled to first PMOS transistor 212 and the gate of third NMOS transistor 318 of first latch driver 310. A second latch driver 320 may have a second PMOS transistor 222 coupled to a latch node 324 and to at least three serially coupled NMOS transistors 326, 330, 328. Second sense amplifier output 208 could be gate coupled to both the gate of second PMOS transistor 222 and third NMOS transistor 328 of second latch driver 320. First supply PMOS transistor 230 may be coupled to latch node 314 of first latch driver 310. Through latch node 314, first supply PMOS transistor 230 may also be gate coupled to both the gate of second supply PMOS transistor 232 and the gate of first transistor 326 of second latch driver 320. The output or drain of second supply PMOS transistor 232 may be coupled to latch node 324 of second latch driver 320 and may also be coupled to the gates of both first supply PMOS transistor 230 and first NMOS transistor 316 of first latch driver 310. First and second supply PMOS transistors 230, 232 may also each be source coupled to a second and third voltage source 240, 242 respectively.

Latch circuit 304 may also include a first gated latch 234 coupled to the sources of first and second PMOS transistors 212, 222 of first and second latch drivers 310, 320. First gated latch 234 may include a PMOS transistor gated to a first input signal SETN. First gated latch 234 may also be coupled to a first voltage source 238. Latch circuit 304 may also have an output node 236 coupled to latch node 324 of latch driver 320. Output node 236 may have an output signal RGBLTN having a high/1 or low/0 value. Latch circuit 304 may also include second NMOS transistors 322, 330 of first and second latch driver 310, 320. Second NMOS transistors 322 and 330 may be gated to data input signals AD0. AD0 data input signals may be the same signal or may be different signals. Data input signals AD0 may input either a high/1 or low/0 value, allowing second NMOS transistor 322, 330 to be turned on or off. Additional circuitry may also be added to sense amplifier latch circuit 300 to allow for other types of memory recovery.

Similarly to sense amplifier latch circuit 200, sense amplifier latch circuit 300 operates in both a sensing mode, wherein sense amplifier 202 drives latch circuit 304, and a latching mode, allowing the latch to "hold on" to a bit of data. When sense amplifier latch circuit 300 is activated, AD0 for both first and second latch driver 310, 320 may be high. When AD0 is high, second NMOS transistors 322, 330 of first and second latch driver 310, 320 are enabled. Latching mode and sensing mode may occur in the same manner as discussed in regards to sense amplifier latch circuit 200, found in FIG. 2.

Figure 4:
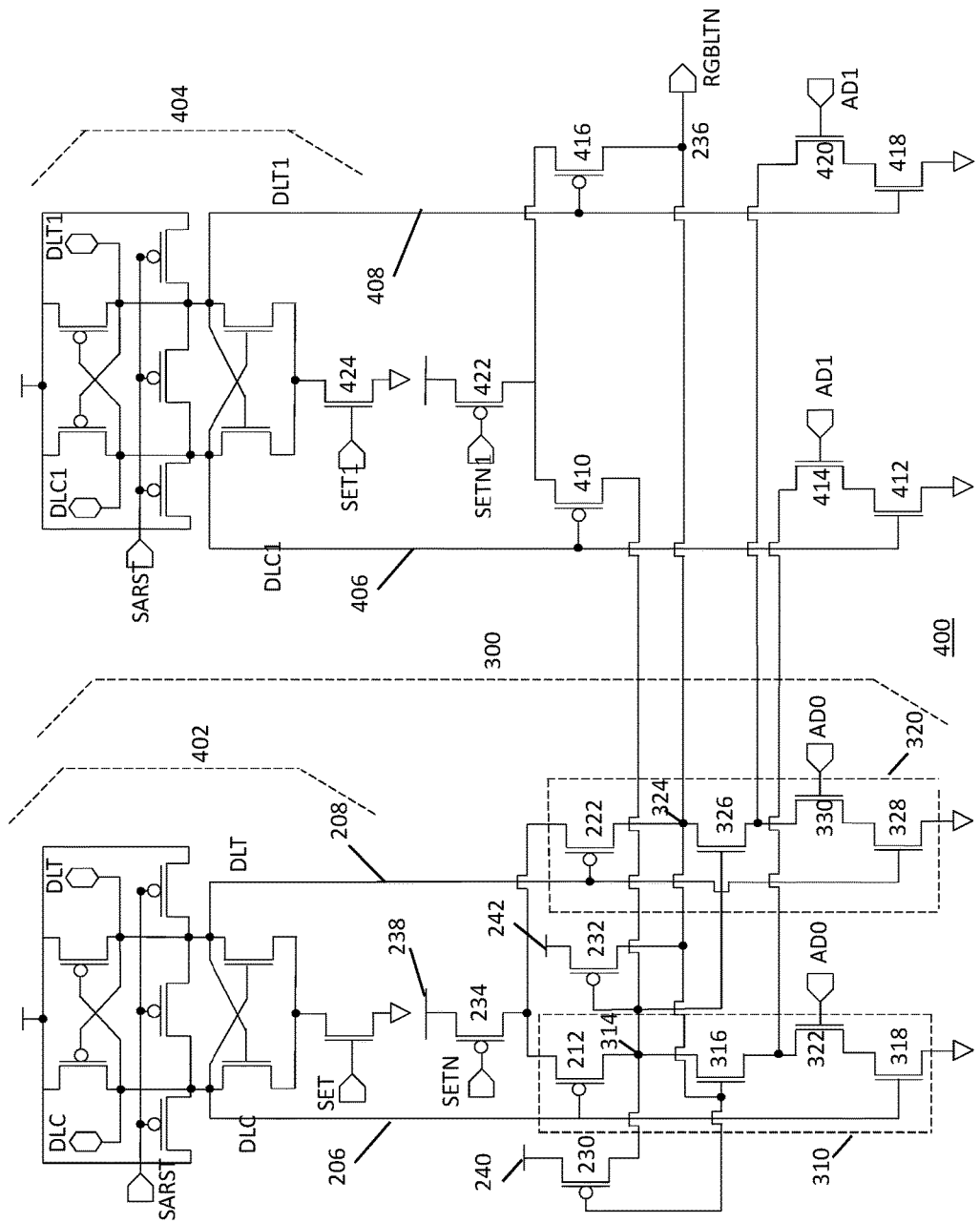
FIG. 4 shows a schematic view of a sense amplifier multiplexed latch circuit.

FIGS. 3 and 4 together illustrate an embodiment of a sense amplifier multiplexed latch circuit 400. A multiplexer is required when using a multi-bank memory, and allows for the circuit to know which memory bank the lead data is coming from. Sense amplifier multiplexed latch circuit 400 may include at least two sense amplifier circuits 402 and 404. First and second sense amplifiers 402, 404, may have different sense enabling signals or clock signals SET and SET1 respectively. Generally, when SET is high or low, SET1 will be the opposite value. However, there may be some situations when SET and SET1 will have the same signal value. FIG. 4 shows sense amplifier latch circuit 300 (FIG. 3) connected to another sense amplifier circuitry. In addition to the structure discussed in relation to FIG. 3, sense amplifier latch circuit 300 may also be connected to additional circuitry as shown in FIG. 4. Specifically, in addition to sense amplifier latch circuit 300, sense amplifier multiplexed latch circuit 400 may also include a second latch circuit driven by a third and fourth sense amplifier output 406, 408 from a second sense amplifier 404. Third sense amplifier output 406 may be gate coupled to both a first control PMOS transistor 410 and a first NMOS transistor 412 of a first set of serially coupled NMOS transistors 412, 414. Fourth sense amplifier output 408 may be gate coupled to both a second control PMOS transistor 416 and a first NMOS 418 of a second set of serially coupled NMOS transistors 418, 420. Second NMOS transistor 414 of first set of serially coupled NMOS transistors 412, 414 may be coupled to an output of second NMOS transistor 316 of first latch driver 310. Second NMOS transistor 420 of second set of serially coupled NMOS transistors 418, 420 may be coupled to an output of second NMOS transistor 326 of second latch driver 320. First and second control PMOS 410, 416, gated to third and fourth sense amplifier outputs 406, 408, may also be coupled to latch nodes 314, 324 of first and second latch 310, 320. Sense amplifier multiplexed latch circuit 400 may also include second NMOS transistors 322, 330, of first and second latch drivers 310, 320 being coupled to a first input data signal AD0. A second input data signal AD1 may be gated to second NMOS transistors 414, 420 of first and second set of serially coupled NMOS transistors 412, 414 and 418, 420 respectively. Sense amplifier multiplexed latch circuit 400 may further include a first gated latch 234 coupled to first and second PMOS transistors 212, 222, of first and second latch drive 310 and 320. Sense amplifier multiplexed latch circuit 400 may also include a second gated latch 422. Second gated latch 422 may be coupled to control PMOS transistors 410, 416, of second latch circuit.

While AD0 and AD1 can be preset before circuit use, these data inputs cannot change while sense amplifier multiplexed latch circuit 400 is in sensing mode. Sensing mode occurs when SET or SET1 is high and SETN or SETN1 is low. AD0 and AD1 can only change values when SET and SET1 are both low. AD0 and AD1 may have a high/1 or low/0 signal value, but in a preferred embodiment AD0 and AD1 would have opposite values.

The following includes examples of how sense amplifier multiplexed latch circuit 400 may operate in sensing and latching modes. Sense amplifier multiplexed latch circuit 400 would sense a low/0 value during sensing mode if SET signal is high, SETN is low, and SET1 is low, SETN1 is high. As a result, sense amplifier 402 and outputs DLT and DLC will drive the latch circuit. For this example, sense amplifier multiplexed latch circuit 400 will have a high AD0 signal value, DLT will be low and DLC will be high. The DLT low value passes through sense amplifier output 206 and enables first PMOS transistor 212 of first latch driver 310. Because SETN is low PMOS transistor of gated latch 234 is enabled, allowing a high value to pass from first voltage source 238, through first PMOS transistor 212. This high value enables first NMOS transistor 326 of second latch driver 320. Because DLC is high, a high value flows through sense amplifier output 208 and enables third NMOS 328 of second latch driver 320. Second NMOS transistor 330 is enabled via high input AD0. As a result, all three serially connected NMOS transistors 326, 330, 328 are all enabled and pull the value of latch node 324 of second latch driver 320 low/0. This pull occurs as a result of the three NMOS transistors 326, 330, 328 being connected to ground. The resulting signal value out of output node 236 is a low/0 RGBLTN.

Sense amplifier multiplexed latch circuit 400 would sense a high/1 value during sensing mode if SET signal is high, SETN is low, and SET1 is low, SETN1 is high. As a result sense amplifier 402 and outputs DLT and DLC will drive latch circuit 304. For this example the sense amplifier multiplexed latch circuit 400 will have a high AD0, DLT will be high and DLC will be low. The DLT high value will flow through sense amplifier outputs 206 and enable third NMOS transistor 318 of first latch driver 310. SETN is low and enables the PMOS transistor of gated latch 234. This allows a high value to pass through gated latch 234 from first voltage source 238. Because DLC is a high value, the high value will pass through sense amplifier output 208 and enable second PMOS transistor 222 of the second latch driver. When second PMOS transistor 222 is enabled, this allows the high value flowing from first voltage source 238 to pass through latch node 324 of second latch driver 320 and through output node 236 to produce a high/1 RGBLTN signal.

Sense amplifier multiplexed latch circuit 400 would latch a high/1 value during latching mode if SET signal is low, SETN is high, and SET1 is high, SETN1 is low. For this example the circuit will have AD0 be high, DLT will be high and DLC will be high. Because SET is low and SETN is high, neither transistor will be enabled. Since DLC is high, a high level passes through sense amplifier output 206 to enable third NMOS transistor 318 of first latch driver 310. DLT is also high and enables third NMOS transistor 328 of second latch drive 320. When sense amplifier multiplexed latch circuit 400 is in latching mode, some areas of the circuit have high/low values already due to the previous process. Because sense amplifier multiplexed latch circuit 400 is latching a high/1 value the gate of first NMOS transistor 316 of first latch driver 310 holds a high value and is enabled; due to the previous process. Second NMOS transistor 322 is enabled via a high AD0 signal. As a result, all three serially connected NMOS transistors 316, 322, 318 of first latch driver 310 are enabled and pull the value of latch node 314 to a low/0 value. This low value then enables second supply PMOS transistor 232. Second Supply PMOS transistor 232 is source coupled to third voltage 242. This results in second supply PMOS transistor 232 outputting a high/1 value and outputting a high/1 RGBLTN signal via output node 236.

Sense amplifier multiplexed latch circuit 400 would latch a low/0 value during latching mode if SET signal is low, SETN is high, and SET1 is high, SETN1 is low. For this example the circuit will have a high AD0 signal, DLT will be high and DLC will be high. Because SET is low and SETN is high, neither transistor will be enabled. Because DLT and DLC are high both sense amplifier outputs 206, 208 will have a high value enabling third NMOS transistors 318, 328 of first and second latch driver 310, 320. AD0 is high and enables second NMOS transistors 322, 330. Similar to the latching process where a high/1 value is latched, due to the previous process conditions, a low/0 value is elicited at the gate of first supply PMOS transistor 230. As a result of this low value, first supply PMOS transistor 230 is enabled and allows a high/1 value to flow from second voltage source 240 to latch node 314 and ultimately enable first NMOS transistor 222 of second latch driver 320. As a result all three serially coupled NMOS transistors 222, 326, 328 of second latch driver 320 are enabled and pulls the value of latch node 324 low/0 to produce a low/0 latched output RGBLTN.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A sense amplifier latch circuit comprising:
   a latch circuit driven by a first and second sense amplifier output;
   a first latch driver having a first PMOS transistor coupled to a latch node and to a pair of serially coupled NMOS transistors, wherein the first sense amplifier output is gate coupled to the first PMOS transistor and the first NMOS transistor of the first latch driver;
   a second latch driver having a second PMOS transistor coupled to a latch node and to a pair of serially coupled NMOS transistors, wherein the second sense amplifier output is gate coupled to the second PMOS transistor and the second NMOS transistor of the second latch driver;
   a first and second supply PMOS transistor, wherein an output of the first supply PMOS transistor is coupled to the latch node of the first latch driver and to a gate of both the second supply PMOS transistor and first NMOS transistor of the second latch driver, and wherein an output of the second supply PMOS transistor is coupled to the latch node of the second latch driver and to a gate of both the first supply PMOS transistor and second NMOS transistor of the first latch driver.

2. The sense amplifier latch circuit of claim 1, wherein an output of a first gated latch is coupled to the first and second PMOS transistor.

3. The sense amplifier latch circuit of claim 2, wherein the first gated latch is gated to a first input signal and connected to a first voltage source.

4. The sense amplifier latch circuit of claim 1, wherein the sense amplifier further comprises a first set of initial inputs.

5. The sense amplifier latch circuit of claim 1, wherein the sense amplifier further comprises a sensing gated transistor having a first sense enabled input signal.

6. The sense amplifier latch circuit of claim 1, further comprising an output node coupled to the latch node of the second latch driver.

7. A sense amplifier latch circuit comprising:
   a latch circuit driven by a first and a second sense amplifier outputs;
   a first latch driver having a first PMOS transistor coupled to a latch node and to at least three serially coupled NMOS transistors, wherein the first sense amplifier output is gate coupled to the first PMOS transistor and the third NMOS transistor of the first latch driver;
   a second latch driver having a second PMOS transistor coupled to a latch node and to at least three serially coupled NMOS transistors, wherein the second sense amplifier output is gate coupled to the second PMOS and the third NMOS transistor of the second latch driver;
   a first and second supply PMOS transistor, wherein an output of the first supply PMOS transistor is coupled to the latch node of the first latch driver and to a gate of both the second supply PMOS transistor and the first NMOS transistor of the second latch driver, and wherein an output of the second supply PMOS transistor is coupled to the latch node of the second latch driver and to a gate of both the first supply PMOS transistor and the first NMOS transistor.

8. The sense amplifier latch circuit of claim 7, wherein an output of a first gated latch is coupled to the first and second PMOS transistor.

9. The sense amplifier latch circuit of claim 8, wherein the first gated latch is gated to a first input signal and connected to a first voltage source.

10. The sense amplifier latch circuit of claim 7, wherein the sense amplifier further comprises a first set of initial inputs.

11. The sense amplifier latch circuit of claim 7, wherein the sense amplifier further comprises a sensing gated transistor having a first sense enabled input signal.

12. The sense amplifier latch circuit of claim 7, further comprising an output node coupled to the latch node of the second latch driver.

13. The sense amplifier latch circuit of claim 7, wherein each of the first and second supply PMOS transistors are connected to a second and third voltage source respectively.

14. The sense amplifier latch circuit of claim 7, wherein each of the second NMOS transistors of the first and second latch drivers are gated to an input signal.

15. The sense amplifier latch circuit of claim 14, wherein the input signal of first and second latch drivers is the same input signal.

16. A sense amplifier multiplexed latch circuit comprising:
- a first latch circuit driven by a first and a second sense amplifier outputs;
- a first latch driver having a first PMOS transistor coupled to a latch node and to at least three serially coupled NMOS transistors, wherein the first sense amplifier output is gate coupled to the first PMOS transistor and the third NMOS transistor of the first latch driver;
- a second latch driver having a second PMOS transistor coupled to a latch node and to at least three serially coupled NMOS transistors, wherein the second sense amplifier output is gate coupled to the second PMOS and the third NMOS transistor of the second latch driver;
- a first and second supply PMOS transistor, wherein an output of the first supply PMOS transistor is coupled to the latch node of the first latch driver and to a gate of both the second supply PMOS transistor and the first NMOS transistor of the second latch driver, and wherein an output of the second supply PMOS transistor is coupled to the latch node of the second latch driver and to a gate of both the first supply PMOS transistor and the first NMOS transistor;
- a second latch circuit driven by a third and fourth sense amplifier outputs, wherein each of the third and fourth outputs are gate coupled to a control PMOS transistor and a first NMOS transistor of a set of serially coupled NMOS transistors, wherein each of the second NMOS transistors, of the set of serially coupled NMOS transistors, are coupled to an output of the second NMOS transistor of the first and second latch, and wherein the control PMOS transistors, gated to the third and fourth outputs, are coupled to the latch nodes of the first and second latch.

17. The sense amplifier latch circuit of claim 16, wherein each of the second NMOS transistors of the first and second latch drivers are gated to a first input data signal.

18. The sense amplifier multiplexed latch circuit of claim 16, wherein each of the second NMOS transistors of the set of serially connected NMOS transistors of the second latch circuit are gated to a second input data signal.

19. The sense amplifier multiplexed latch circuit of claim 16, wherein an output of a first gated latch is coupled to the first and second control PMOS transistors.

20. The sense amplifier multiplexed latch circuit of claim 16, wherein an output of a second gated latch is coupled to the control PMOS transistors of the second latch circuit.

* * * * *